United States Patent
Park et al.

(10) Patent No.: US 10,714,682 B2
(45) Date of Patent: Jul. 14, 2020

(54) RUTHENIUM REMOVAL COMPOSITION AND METHOD OF PRODUCING MAGNETORESISTIVE RANDOM ACCESS MEMORY

(71) Applicant: FUJIFILM CORPORATION, Minato-ku, Tokyo (JP)

(72) Inventors: Keeyoung Park, Shizuoka (JP); Atsushi Mizutani, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 16/245,570

(22) Filed: Jan. 11, 2019

(65) Prior Publication Data

US 2019/0148634 A1  May 16, 2019

Related U.S. Application Data

(60) Division of application No. 15/488,523, filed on Apr. 17, 2017, now abandoned, which is a continuation of
(Continued)

(30) Foreign Application Priority Data

Oct. 31, 2014 (JP) .................................. 2014-222540

(51) Int. Cl.
*H01L 43/12* (2006.01)
*H01L 21/3065* (2006.01)
(Continued)

(52) U.S. Cl.
CPC ................ *H01L 43/12* (2013.01); *C23F 1/30* (2013.01); *C23F 1/40* (2013.01); *C23F 4/00* (2013.01);
(Continued)

(58) Field of Classification Search
CPC ....... H01L 43/12; H01L 27/105; H01L 43/08; H01L 21/308; H01L 21/3065; C23F 1/30; C23F 4/00; C23F 1/40

See application file for complete search history.

(56) References Cited

U.S. PATENT DOCUMENTS

| | | |
|---|---|---|
| 6,586,161 B2 | 7/2003 | Futase et al. |
| 6,869,336 B1 | 3/2005 | Hardikar |

(Continued)

FOREIGN PATENT DOCUMENTS

| | | |
|---|---|---|
| JP | 2001-240985 A | 9/2001 |
| JP | 2002-016053 A | 1/2002 |

(Continued)

OTHER PUBLICATIONS

English language translation of the following: Office action dated Mar. 18, 2019 from the TIPO in a Taiwan patent application No. 104135517 corresponding to the instant patent application.
(Continued)

*Primary Examiner* — Anita K Alanko
(74) *Attorney, Agent, or Firm* — Solaris Intellectual Property Group, PLLC

(57) ABSTRACT

An object is to provide a ruthenium removal composition capable of dissolving Ru while suppressing dissolution of CoFeB, and a method of producing a magnetoresistive random access memory (MRAM) using the same. A ruthenium removal composition of the present invention contains orthoperiodic acid and water, and the pH is 11 or more. It is preferable that the content of orthoperiodic acid in the ruthenium removal composition is 0.01% to 5% by mass with respect to the total mass of the composition.

16 Claims, 2 Drawing Sheets

Related U.S. Application Data application No. PCT/JP2015/080367, filed on Oct. 28, 2015.

(51) Int. Cl.
*H01L 21/308* (2006.01)
*H01L 43/08* (2006.01)
*H01L 27/105* (2006.01)
*C23F 1/40* (2006.01)
*C23F 4/00* (2006.01)
*C23F 1/30* (2006.01)

(52) U.S. Cl.
CPC ........ *H01L 21/308* (2013.01); *H01L 21/3065* (2013.01); *H01L 27/105* (2013.01); *H01L 43/08* (2013.01)

(56) References Cited

U.S. PATENT DOCUMENTS

| | | | |
|---|---|---|---|
| 7,320,942 B2* | 1/2008 | Chen | H01L 21/02071 257/E21.256 |
| 2008/0148649 A1 | 6/2008 | Liu | |
| 2012/0045898 A1 | 2/2012 | Uozumi | |
| 2012/0256122 A1 | 10/2012 | Sato et al. | |
| 2015/0287426 A1* | 10/2015 | Mihajlovic | G11B 5/3932 428/816 |

FOREIGN PATENT DOCUMENTS

| | | |
|---|---|---|
| JP | 2006-148149 A | 6/2006 |
| JP | 2006-173454 A | 6/2006 |
| JP | 2011-249590 A | 12/2011 |
| WO | 2011/030529 A | 3/2011 |

OTHER PUBLICATIONS

International Search Report issued in International Application No. PCT/JP2015/080367 dated Dec. 28, 2015.
Written Opinion of the ISA issued in International Application No. PCT/JP2015/080367 dated Dec. 28, 2015.
English language translation of the following: Office action dated Dec. 5, 2017 from the JPO in a Japanese patent application No. 2016-556596 corresponding to the instant patent application.
English language translation of the following: Office action dated Jul. 4, 2018 from the TIPO in a Taiwan patent application No. 10720595880 corresponding to the instant patent application.
Machine English translation of: JP 2006-173454, Jun. 29, 2006, Fumiharu et al.
Restriction Requirement dated Feb. 1, 2018 issued by USPTO in U.S. Appl. No. 15/488,523.
Non-Final Office Action dated Mar. 21, 2018 issued by USPTO in U.S. Appl. No. 15/488,523.
Final Office Action dated Oct. 18, 2018 issued by USPTO in U.S. Appl. No. 15/488,523.

* cited by examiner

RUTHENIUM REMOVAL COMPOSITION AND METHOD OF PRODUCING MAGNETORESISTIVE RANDOM ACCESS MEMORY

CROSS-REFERENCE TO RELATED APPLICATIONS

This application is a divisional application of U.S. patent application Ser. No. 15/488,523, filed Apr. 17, 2017, which is a continuation application of International Application No. PCT/JP2015/080367, filed Oct. 28, 2015, and claims priority to Japanese Patent Application No. 2014-222540, filed Oct. 31, 2014. The disclosures of all of the above applications are incorporated herein by reference in their entireties.

BACKGROUND OF THE INVENTION

1. Field of the Invention

The present invention relates to a ruthenium removal composition and a method of producing a magnetoresistive random access memory.

2. Description of the Related Art

Processing of a semiconductor substrate includes various multistage processing steps. In the production process, a process of patterning a semiconductor layer, an electrode, and the like by dry etching is important. In the dry etching, an object to be treated is processed by generating plasma (discharge) in the inside of a device chamber and using ions or radicals generated in the inside thereof.

On the other hand, there are many cases in which the object to be treated is not completely removed in the dry etching and residues thereof usually remain on the substrate after processing. In addition, in ashing performed when a resist or the like is removed, residues similarly remain on the substrate. It is required to effectively remove these residues without damaging the processed substrate.

As the size of the wiring and integrated circuit of a semiconductor substrate becomes smaller, the importance of accurately performing residue removal without corroding a member to be left of cobalt iron boron (CoFeB), magnesium oxide (MgO), or the like becomes higher.

In recent years, with the progress of high integration and high speed of semiconductor devices and the like, a noble metal such as ruthenium (Ru) is used as an object to be etched.

JP2001-240985A discloses a method of treating a solid surface using a treatment liquid containing an oxidizing agent.

In addition, JP2006-148149A discloses a mass production method of a semiconductor integrated circuit device in which a ruthenium-containing film is removed in an external edge portion of a device surface or on a back surface thereof.

SUMMARY OF THE INVENTION

The material constituting a semiconductor substrate during processing and residues remaining by dry etching or the like usually have common constitutional elements. Accordingly, it is not easy to accurately remove only the residues thereof while suppressing damage to the semiconductor substrate.

In addition, it is not easy to secure a sufficient dissolution rate for etching residues containing Ru which is a platinum group element.

An object of the present invention is to provide a ruthenium removal composition capable of dissolving Ru while suppressing dissolution of CoFeB, and a method of producing a magnetoresistive random access memory (MRAM) using the same.

The above-mentioned problems of the present invention have been solved by the following means of <1> or <7>. <2> to <6>, <8>, and <9>, which are preferable embodiments, are also described below.

<1> A ruthenium removal composition including: orthoperiodic acid; and water, in which the pH is 11 or more.

<2> The ruthenium removal composition according to <1>, in which the content of orthoperiodic acid is 0.01% to 5% by mass with respect to the total mass of the composition.

<3> The ruthenium removal composition according to <1> or <2>, in which the content of water is 30% by mass or more with respect to the total mass of the composition.

<4> The ruthenium removal composition according to any one of <1> to <3>, further including: at least one selected from the group consisting of tetramethylammonium hydroxide, tetraethylammonium hydroxide, and monoethanolamine, as a pH adjusting agent.

<5> The ruthenium removal composition according to <4>, in which the content of the pH adjusting agent is 0.01% to 5% by mass with respect to the total mass of the composition.

<6> The ruthenium removal composition according to any one of <1> to <5>, which is used for removing MRAM dry etching residues.

<7> A method of producing a magnetoresistive random access memory including: an etching step of drying etching a semiconductor substrate including a ferromagnetic layer containing CoFeB and/or CoFe, and a Ru-containing layer containing Ru; and a residue removal step of removing dry etching residues with the ruthenium removal composition according to any one of <1> to <6>.

<8> The method of producing a magnetoresistive random access memory according to <7>, in which the semiconductor substrate further includes an insulator layer containing MgO.

<9> The method of producing a magnetoresistive random access memory according to <7> or <8>, in which the dissolution rate of MgO of the ruthenium removal composition is 2 nm/min or less.

According to the present invention, it is possible to provide a ruthenium removal composition capable of dissolving Ru while suppressing dissolution of CoFeB, and a method of producing a magnetoresistive random access memory using the same.

DESCRIPTION OF THE PREFERRED EMBODIMENTS

Figure 1:
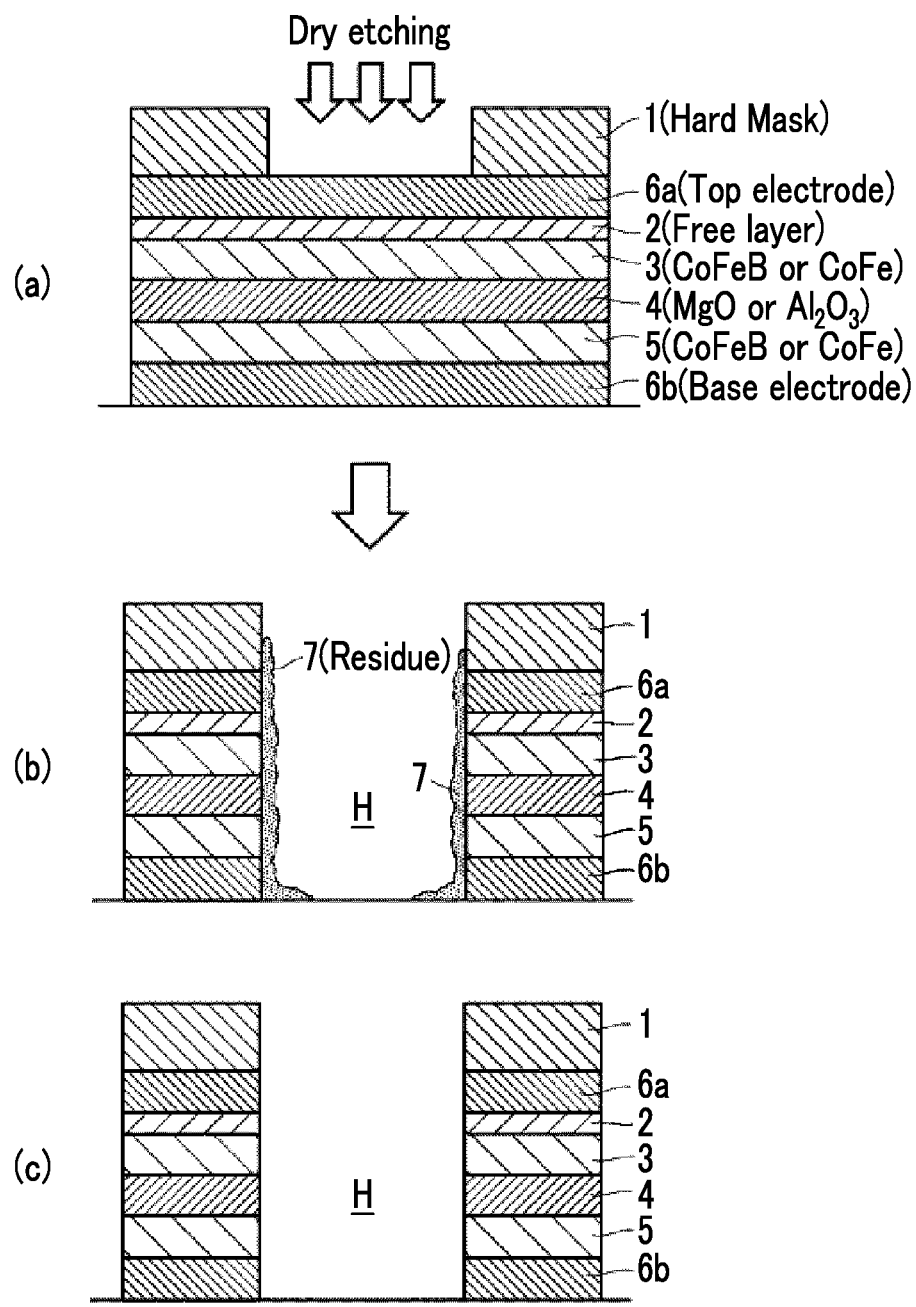
FIG. 1 is a cross-sectional view schematically showing an example of a step of producing a semiconductor substrate according to an embodiment of the present invention.

Hereinafter, the contents of the present invention will be described in detail. The descriptions of constituent elements described below are provided based on representative embodiments, but the present invention is not limited to these embodiments. In addition, in the specification, numerical values indicated using the expression "to" mean a range including the numerical values indicated before and after the expression "to" as the lower limit and the upper limit.

Incidentally, the term "group (a group of atoms)" used herein is intended to include both unsubstituted and substituted ones unless designated as "unsubstituted" or "substituted". For example, the term "alkyl group" used herein includes not only an alkyl group having no substituent (an unsubstituted alkyl group) but also an alkyl group having a substituent (a substituted alkyl group).

In addition, each component in the composition of the specification can be used alone or in combination of two or more thereof.

In the present invention, "part(s) by mass" and "% by mass" have the same meaning as "part(s) by weight" and "% by weight", respectively.

Further, in the following description, a combination of preferable embodiments is a more preferable embodiment.

(Ruthenium Removal Composition)

A ruthenium removal composition of the present invention (hereinafter, also simply referred to as a "composition") includes orthoperiodic acid and water, and the pH thereof is 11 or more.

The orthoperiodic acid is assumed to exhibit an action of dissolving Ru in the system. It is difficult to predict a chemical state of residues of the element of each layer by a dry etching step. Accordingly, it is difficult to specify how the ruthenium removal composition of the present invention and the oxidizing agent contained in the composition act on which metal component. However, in the embodiment, it is interpreted that effective removal of residues, a composition having a pH of 11 or more, and protection of each layer of the substrate (particularly, the ferromagnetic layers and the insulator layer) can be realized by imparting Ru removability by the oxidizing agent.

It is preferable that the ruthenium removal composition of the present invention is used for removing MRAM dry etching residues or producing a magnetoresistive random access memory.

Hereinafter, each component including other components will be described.

<Orthoperiodic Acid>

The ruthenium removal composition of the present invention includes orthoperiodic acid.

The content of orthoperiodic acid in the ruthenium removal composition is preferably 0.01% by mass or more, more preferably 0.1% by mass or more, and even more preferably 0.5% by mass or more with respect to the total mass of the composition. The upper limit is preferably 10% by mass or less, more preferably 5% by mass or less, and even more preferably 3% by mass or less.

<Water>

The ruthenium removal composition of the present invention includes water. Water may be a water-soluble medium including a dissolved component within a range not impairing the effects of the present invention or may contain a small amount of unavoidable mixing components. Of these, water, which is subjected to a purification treatment, such as distilled water and ion exchange water or ultrapure water, is preferable and ultrapure water to be used for producing a semiconductor is particularly preferable.

Although the content of water in the ruthenium removal composition is not particularly limited, the content of water is preferably 30% by mass or more, more preferably 50% by mass or more, even more preferably 70% by mass or more, and particularly preferably 90% by mass or more with respect to the total mass of the composition. Although the upper limit is not particularly limited, the upper limit is preferably 99% by mass or less.

<pH Adjusting Agent>

It is preferable that the ruthenium removal composition of the present invention contains a pH adjusting agent. Needless to say, the pH adjusting agent is a component other than the aforementioned oxidizing agent and water.

Preferable examples of the pH adjusting agent include an organic amine compound and a quaternary ammonium hydroxide and a quaternary ammonium hydroxide is more preferable.

Among these, it is preferable that the ruthenium removal composition contains at least one selected from the group consisting of tetramethylammonium hydroxide, tetraethylammonium hydroxide, and monoethanolamine, and, it is more preferable that the ruthenium removal composition contains tetraethylammonium hydroxide or monoethanolamine from the viewpoint of toxicity.

The content of the pH adjusting agent in the ruthenium removal composition may be appropriately selected so that a desired pH is obtained in the entire composition and is preferably 0.01% by mass or more, more preferably 0.5% by mass or more with respect to the total mass of the composition. The upper limit is preferably 10% by mass or less, more preferably 8% by mass or less, and even more preferably 5% by mass or less.

The organic amine compound and the quaternary ammonium hydroxide will be described below, respectively.

[Organic Amine Compound]

The organic amine compound is a general term for compounds having any of a primary amino group, a secondary amino group, and a tertiary amino group in the molecule. However, the organic amine compound includes an amine oxide compound. The organic amine compound has a carbon atom, a nitrogen atom, and a hydrogen atom as essential constituent elements and is preferably a compound including an oxygen atom as required.

As the organic amine compound, a compound represented by any of the following Formulae (P-1) to (P-5) is exemplified.

 (P-1)

 (P-2)

 (P-3)

 (P-4)

 (P-5)

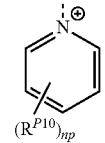

$R^{P1}$ to $R^{P9}$ each independently represent an alkyl group (preferably having 1 to 6 carbon atoms), an alkenyl group (preferably having 2 to 6 carbon atoms), an alkynyl group (preferably having 2 to 6 carbon atoms), an aryl group (preferably having 6 to 10 carbon atoms), a heterocyclic group (preferably having 2 to 6 carbon atoms), an acyl group (preferably having 1 to 6 carbon atoms), an aryloyl group (preferably having 7 to 15 carbon atoms), an alkoxy group (preferably having 1 to 6 carbon atoms), an aryloxy group (preferably 6 to 14 carbon atoms), an alkoxy carbonyl group (preferably having 2 to 6 carbon atoms), an alkoxy carbonyl amino group (preferably having 2 to 6 carbon atoms), or a group represented by the following Formula (x).

Among these, $R^{P1}$ to $R^{P9}$ are preferably each independently an alkyl group, an alkenyl group, an aryl group, an alkoxy group, an aryloxy group, or a group represented by the following Formula (x), and particularly preferably an alkyl group, an alkoxy group, or a group represented by the following Formula (x).

These groups may further have a substituent group T. Among these, the substituent group T is preferably a hydroxyl group (OH), a carboxyl group (COOH), a sulfanyl group (SH), an alkoxy group, or a thioalkoxy group as an arbitrary substituent to be added. In addition, each of an alkyl group, an alkenyl group, and an alkynyl group may include 1 to 4 O's, S's, CO's, and $NR^N$'s ($R^N$ represents a hydrogen atom or an alkyl group having 1 to 6 carbon atoms), respectively.

$$X1\text{-}(Rx1\text{-}X2)mx\text{-}Rx2\text{-}* \tag{x}$$

X1 represents a hydroxyl group, a sulfanyl group, an alkoxy group having 1 to 4 carbon atoms, or a thioalkoxy group having 1 to 4 carbon atoms. Among these, a hydroxyl group is preferable.

Rx1 and Rx2 each independently represent an alkylene group having 1 to 6 carbon atoms, an alkenylene group having 2 to 6 carbon atoms, an alkynylene group having 2 to 6 carbon atoms, an arylene group having 6 to 10 carbon atoms, or a group obtained by combining two or more these groups. Among these, an alkylene group having 1 to 6 carbon atoms is preferable.

X2 represents O, S, CO or $NR^N$. Among these, O is preferable.

mx represents an integer of 0 to 6. When mx is 2 or greater, a plurality of Rx1's and X2's are may be the same or different from each other. Rx1 and Rx2 may further have a substituent T.

The symbol "*" indicates a bonding to a nitrogen atom in the Formulae (P-1) to (P-4).

$R^{P10}$ has the same meaning as the above substituent T. np is an integer of 0 to 5.

It is preferable that the organic amine compound is selected from the group consisting of monoethanolamine, diglycolamine (aminoethoxy ethanol), monoisopropanolamine, isobutanolamine, $C_2$ to $C_8$ alkanolamines, methylethanolamine, N-methylaminoethanol, diethanolamine, triethanolamine, methyl diethanolamine, triethylamine, pentamethyl diethylenetriamine, N-methylmorpholine-N-oxide (NMMO), trimethylamine-N-oxide, triethylamine-N-oxide, pyridine-N-oxide, N-ethylmorpholine-N-oxide, N-methylpyrrolidine-N-oxide, N-ethylpyrrolidine-N-oxide, substituted derivatives thereof, and a combination thereof. Among these, alkanolamine is preferable and monoethanolamine or diglycolamine is particularly preferable. The substituent derivative is a general term for compounds having a substituent (for example, the substituent group T to be described later) in each compound.

[Quaternary Ammonium Hydroxide]

As the quaternary ammonium hydroxide, a tetraalkylammonium hydroxide is preferable, and a tetraalkylammonium hydroxide substituted with a lower (having 1 to 4 carbon atoms) alkyl group is more preferable. Specific examples of the tetraalkylammonium hydroxide include tetramethylammonium hydroxide (TMAH), tetraethylammonium hydroxide (TEAH), tetrapropylammonium hydroxide (TPAH), tetrabutylammonium hydroxide (TBAH), methyltripropylammonium hydroxide, and cetyltrimethylammonium hydroxide.

Examples of the quaternary ammonium hydroxide further include trimethyl(2-hydroxyethyl)ammonium hydroxide (choline), methyltri(2-hydroxyethyl)ammonium hydroxide, tetra(2-hydroxyethyl)ammonium hydroxide, and benzyltrimethylammonium hydroxide (BTMAH).

Among these, as the quaternary ammonium hydroxide, TMAH, TEAH, TPAH, TBAH, and choline are preferable and TMAH, TEAH, and TBAH are more preferable.

In the specification, when a compound or a substituent, a linking group, or the like contains, an alkyl group, an alkylene group, an alkenyl group, an alkenylene group, or the like, these groups may be cyclic or chain, may be linear or branched, and may be substituted with an arbitrary group or unsubstituted. At this time, an alkyl group, an alkylene group, an alkenyl group, an alkenylene group, an alkynyl group, and an alkynylene group may include a group including a hetero atom (for example, O, S, CO, or $NR^N$) and thus a ring structure may be formed. In addition, when an aryl group, a heterocyclic group, and the like are included, these may be a single ring or a condensed ring and may be substituted or unsubstituted in the same manner.

In the specification, adjacent substituents may be linked within a range of exhibiting the effects of the present invention to form a ring. At this time, adjacent substituents may be linked to a group including a hetero atom.

In the specification, it is possible to combine each technical item such as temperature and thickness as well as the options for the substituent or the linking group of the compound even when the lists thereof are each independently described.

In the specification, when a compound is specified by being added at the end of the compound, the meaning of the compound includes a salt thereof and an ion thereof in addition to the above compound within a range of exhibiting the effects of the present invention. Further, similarly, the meaning also includes a derivative thereof.

<Other Components>

The ruthenium removal composition of the present invention may further contain arbitrary components. For example, various surfactants described in paragraph "0026" of JP2014-093407A, paragraphs "0024" to "0027" of JP2013-055087A, paragraphs "0024" to "0027" of JP2013-012614A, and the like may be used. Alternatively, various additives (anticorrosive and the like) disclosed in paragraphs "0017" to "0038" of JP2014-107434A, paragraphs "0033" to "0047" of JP2014-103179A, paragraphs "0017" to "0049" of JP2014-093407A, and the like may be used.

<pH>

In the present invention, the pH of the ruthenium removal composition is 11 or more, preferably 11 to 14, more preferably 11 to 13, and even more preferably 11 to 12.

When the pH of the ruthenium removal composition is 11 or more, CoFeB and MgO are hardly dissolved and thus this case is preferable. In addition, when the pH is within the above range, modification of the surface of the film caused by contact with a high pH treatment liquid is suppressed.

The pH can be measured at room temperature (25° C.) using F-51 (trade name) manufactured by Horiba, Ltd.

<Dissolution Rate>

The dissolution rate by Ru, MgO, CoFeB, or other metals can be measured by the following method.

Here, the dissolution rate is measured by the following method. Specifically, on a commercially available silicon wafer, substrates on which target layers (for example, a CoFeB layer and a MgO layer) are formed are respectively prepared. The thickness of each layer is, for example, 50 nm (500 Å). The substrate is put into a container filled with the composition and is stirred at 250 rpm. The treatment temperature is set to 25° C. and the treatment time is set to 10 minutes. The test substrate after treatment is taken out and subjected to rinsing with isopropanol and the film thicknesses before and after the etching treatment are measured using ellipsometry (Vase, spectroscopic ellipsometer, manufactured by J. A. Woollam, Japan) to calculate the dissolution rate. The average value at five points is adopted (measurement conditions: measurement range: 1.2 to 2.5 eV, measuring angles: 70 degrees and 75 degrees).

A dissolution rate A of Ru is preferably 0.05 nm/min or more, more preferably 0.2 nm/min or more, and even more preferably 1 nm/min or more. The upper limit is infinite without particular limitation and is preferably 1010 or less.

A dissolution rate B of MgO is preferably 2 nm/min or less, more preferably 1 nm/min or less, and even more preferably 0.5 nm/min or less. The lower limit is 0 nm/min and the lower the rate is, the more preferable it is.

A dissolution rate C of CoFeB is preferably 1 nm/min or less, more preferably 0.2 nm/min, and even more preferably 0.1 nm/min or less. The lower limit is 0 nm/min and the lower the rate is, the more preferable it is.

In addition, in the case in which the dissolution rate C is more than 0 nm/min, the value of dissolution rate A/dissolution rate C is more preferably 20 or more and even more preferably 100 or more.

The upper limit is infinite without particular limitation and is preferably $10^{10}$ or less.

When the value of dissolution rate A/dissolution rate C is within the above range, for example, in the case of using the composition for removing etching residues in MRAM processing, it is possible to remove Ru-containing etching residues while suppressing dissolution of a ferromagnetic layer containing CoFeB.

(Method of Producing Magnetoresistive Random Access Memory)

A method of producing a magnetoresistive random access memory of the present invention includes an etching step of dry etching a semiconductor substrate, and a residue removal step of removing dry etching residues with the ruthenium removal composition of the present invention, and the semiconductor substrate includes a ferromagnetic layer containing CoFeB and/or CoFe, and a Ru layer containing Ru.

In addition, it is preferable that the semiconductor substrate further includes an insulator layer containing MgO.

<Etching Step>

The method of producing a magnetoresistive random access memory of the present invention includes an etching step of dry etching a semiconductor substrate.

FIG. 1(a) is a view showing an example of a semiconductor substrate before dry etching is performed. As the lamination structure of MRAM of the embodiment is described from the lower layer, the MRAM includes a base electrode 6b, a first ferromagnetic layer 5, an insulator layer 4, a second ferromagnetic layer 3, a free layer 2, and a top electrode 6a. In the processing step of this stage, a pattern is formed by a hard mask 1 for the following dry etching. The material for the hard mask 1 is not particularly limited and an arbitrary material such as tantalum (Ta) and tungsten (W) can be appropriately selected and employed. Although not shown in the drawing, a silicon wafer is present below the shown laminate. The material for the silicon wafer is not particularly limited and a substrate constituted of Si, $SiO_2$, or the like can be appropriately employed. A commercially available silicon wafer may be also used.

The materials for the top electrode 6a and the base electrode 6b are not particularly limited and common electrode materials such as copper, aluminum, titanium nitride (TiN), and Ru can be used. It is preferable that the electrodes include Ru.

The materials for constituting the first ferromagnetic layer 5 and the second ferromagnetic layer 3 are not particularly limited and Fe, CoFe, CoFeB, and the like may be used. It is preferable that the layers include CoFeB and/or CoFe.

Examples of the material for the insulator layer 4 include aluminum oxide ($AlO_x$) and magnesium oxide ($MgO_x$). It is preferable that the layer includes MgO.

Examples of the material for the free layer 2 include permalloy (Py) (Fe—Ni alloy), and Co—Fe alloy.

The materials for these layers can be used by appropriately selecting each material to be applied to MRAM. The method of forming each layer is not particularly limited and each layer can be appropriately formed by a molecular beam epitaxy (MBE) method or the like.

MRAM is a memory using a ferromagnetic tunnel junction (MTJ) having a basic structure of ferromagnetic body/insulator/ferromagnetic body. The operation principle thereof is roughly classified into operation principle using giant magnetoresistance effect (abbreviated as GMR effect), operation principle using tunnel magnetoresistance effect (abbreviated as TMR effect), and operation principle using colossal magnetoresistance effect (CMR). The example of FIG. 1 is an element using TMR effect but the present invention is not limited to this example.

In the case of constituting a device using the element, MTJ is disposed at an intersection of a bit line and a write word line arranged in a matrix shape. When a current is applied to the bit line and the write word line, the synthetic magnetic field of magnetic fields induced from the respective conducting wires is applied to the intersection. When the magnetic field generated from only the bit line or write word line does not exceed the magnetic field required for reversing the free layer (switching magnetic field) and the synthetic magnetic field is designed to exceed the switching magnetic field, it is possible to control writing to only the cell present at the intersection of the both conducting wires. When magnetization reversal is caused by simultaneous rotation, the magnetic field required for the reversal is expressed as an asteroid curve.

Examples of the structure of the MTJ element of MRAM which has been proposed so far include CCFA/$AlO_x$/CoFe, Fe/MgO/Fe, CoFe/MgO/CoFe, and CoFeB/MgO/CoFeB using ($Co_{75}Fe_{25}$)$_{80}B_{20}$/AlOx/CoFe/Ru/CoFe/PtMn, Fe/MgO/Fe, $Co_2MnAl$/$AlO_x$/CoFe, and $Co_2(Cr_{1-x}Fe_x)Al$ (CCFA).

For the details of the technologies related to such MRAM, "MRAM/spin memory technology", JP2014-22730A, "Standards and Technology Collection (MRAM and spin memory)" posted on the Japanese Patent Office home page, http://www.jpo.go.jp/shiryou/s_sonota/hyoujun_gijutsu/mram/mokuji.htm (the contents published on May 3, 2014), and the like can be referred to.

FIG. 1(b) shows an example of a state after the laminate in FIG. 1(a) above is subjected to a dry etching treatment. In this state, a portion of the substrate material on which the hard mask 1 is not provided is removed and thus a hole H is formed in the portion. The method for dry etching is not particularly limited and a common method may be used. For example, dry etching can be performed by a dry etching method using a mixed gas having a mixed ratio of a fluorine-based gas and $O_2$ (fluorine-based gas/$O_2$) of 4/1 to 1/5 in terms of flow ratio (the ratio between a fluorine-based gas and oxygen varies depending on the C content of the fluorine-based gas). As representative examples of the dry etching method, methods described in JP1984-126506A (JP-S59-126506A), JP1984-46628A (JP-S59-46628A), JP1983-9108A (JP-S58-9108A), JP1983-2809A (JP-S58-2809A), JP1982-148706A (JP-S57-148706A), and JP1986-41102A (JP-S61-41102A) are known.

Simultaneously, in this step, residues 7 remain in the formed hole H. When the next step proceeds in a state in which the residues remain, conduction failure, material deterioration, and the like may be caused in the portion in which the residues remain when an element is formed. Thus, it is preferable that the residues are removed completely as much as possible by the residue removal step to be described later. In this step, the hard mask 1 may be etched to a considerable degree.

A preferable example of the conditions for the dry etching is as follows.
Treatment parameter
Pressure: 0.5 to 5 Pa
Used gas: Ar/$C_4F_6$ (hexafluoro-1,3-butadiene)/$O_2$=500 to 1,000/5 to 50/20 to 100 mL/min
Treatment temperature: 5° C. to 50° C.
Source power: 100 to 1,000 W
Upper bias/Electrode bias=100 to 1,000/100 to 1,000 W
Treatment time: 50 to 1,000 sec
<Residue Removal Step>

The method of producing a magnetoresistive random access memory of the present invention includes a residue removal step of removing dry etching residues with the ruthenium removal composition of the present invention.

Figure 2:
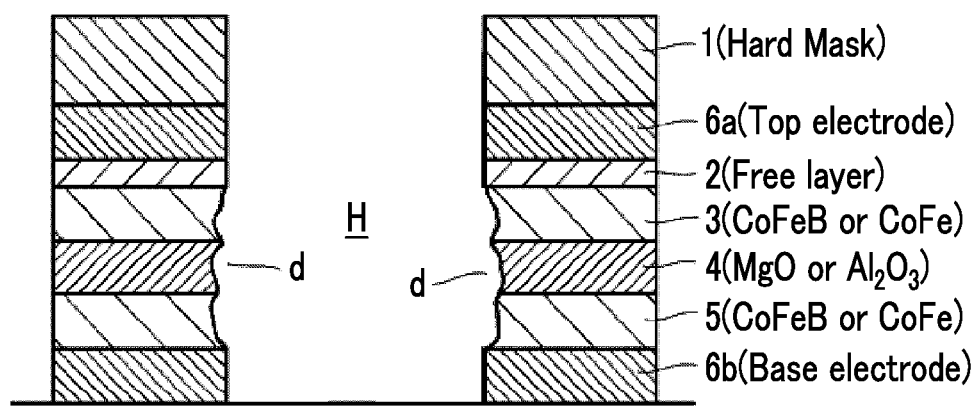
FIG. 2 is a cross-sectional view schematically showing an example of a semiconductor substrate (comparative example) damaged by a residue removal treatment.

FIG. 1(c) shows an example of an embodiment of the semiconductor substrate after the residues are removed. In the residue removal step, as shown in the drawing, it is preferable that the material constituting each layer of the substrate is maintained at a good state after etching without being damaged or corroded. FIG. 2 shows a comparative example for comparison with the above example. In this example, the ferromagnetic layers 3 and 5 and the insulator layer 4 in the semiconductor substrate are under corrosion and thus a damaged portion d in which the material is chipped off in the horizontal direction is formed. It is preferable that the treatment is performed not to cause such damage, if it is possible, by forming the damaged portion d as small as possible. However, it should not be interpreted that the present invention is not limited to the example and comparative example shown in the above drawings.

Incidentally, in the example shown in the drawing, the hard mask 1 remains even after the residues are removed. However, the hard mask 1 may be removed at the same time by the residue removal treatment.

In the residue removal step according to the present invention, the method of removing residues is not particularly limited except that the ruthenium removal composition of the present invention is used, and a known method can be used. It is also preferable to use a known device. For example, a batch type device may be used or a sheet type device may be used. The treatment temperature is preferably 10° C. or higher, more preferably 30° C. or higher, and particularly preferably 40° C. or higher. The upper limit is preferably 100° C. or lower, more preferably 80° C. or lower, and even more preferably 70° C. or lower. Setting the treatment temperature to the above lower limit or higher makes it possible to secure a sufficient removing rate with respect to the residues and thus is preferable. Setting the treatment temperature to the above upper limit or lower makes it possible to maintain temporal stability in treatment rate and thus is preferable. Further, energy consumption is reduced.

Although the thickness of each layer is not particularly limited, the thickness of the ferromagnetic layer is preferably 5 nm or more and 20 nm or less from the viewpoint the effects of the present invention become remarkable. The thickness of the insulator layer is preferably 10 nm or more and 20 nm or less from the viewpoint that the effects of the present invention become remarkable. The thickness of the free layer is preferably 10 nm or more and 20 nm or less from the viewpoint of the function of an element. The thickness of the base electrode or the top electrode is preferably 10 nm or more and 20 nm or less from the viewpoint of the function of an element. The thickness of the hard mask is preferably 10 nm or more and 20 nm or less from the viewpoint of suitability of etching. The thickness of each layer and the dimensions of the members in the semiconductor substrate are evaluated based on an average value at arbitrarily ten points observed with a transmission type electron microscope (TEM) unless otherwise specified.

In addition, the exposure width (thickness of each layer) of the metal layer after etching is not particularly limited and is preferably 2 nm or more and more preferably 4 nm or more from the viewpoint that the advantages of the present invention become remarkable. The upper limit is substantially 1,000 nm or less, preferably 100 nm or less, and more preferably 20 nm or less from the viewpoint that the effects thereof become significant in the same manner.

(Kit)

The ruthenium removal composition of the present invention may be used for a kit obtained by dividing the raw material of the composition into a plurality of parts. For example, an embodiment in which a composition containing the aforementioned pH adjusting agent and water as required is prepared as a first liquid and a composition containing orthoperiodic acid and water as required is prepared as a second liquid is exemplified. At this time, components such other compounds can be separately or collectively incorporated in the first liquid, the second liquid, or another third liquid, respectively. The proportion of each component of the kit is suitably the concentration of each component in the composition with respect to the total amount of the kit.

As the usage example of the kit, an embodiment of preparing a residue removal composition by mixing both of the compositions and then using the composition for the treatment at a suitable time is preferable. In this manner, deterioration of composition performance due to decomposition of respective components is not caused and a desired residue removal action can be effectively exhibited. Here, the term "suitable time" after mixing both of the compositions indicates a period during which a desired action is lost after the mixing, and, specifically, the period is preferably within 24 hours, more preferably within 12 hours, and even more preferably within 8 hours. Although the lower limit is not particularly limited, the lower limit is substantially 1 second or longer.

(Container)

The ruthenium removal composition of the present invention fills an arbitrary container to be stored, transported, and then used as long as corrosion resistance is not a problem (regardless of the container being a kit or not). In addition, a container whose cleanliness is high and in which the amount of impurities to be eluted is small is preferable for the purpose of using the container for a semiconductor. As a usable container, "CLEAN BOTTLE" series (manufactured by ACELLO CORPORATION) or "PURE BOTTLE" (manufactured by KODAMA PLASTICS Co., Ltd.) is exemplified, but the container is not limited to these examples.

(Production of Magnetoresistive Random Access Memory)

In the embodiment, it is preferable that a magnetoresistive random access memory (semiconductor substrate product) having a desired structure is produced through a step of preparing a silicon wafer, a step of forming a semiconductor substrate by forming layers of each metal or metal compound described above on the silicon wafer, a step of dry etching the semiconductor substrate, and a step of removing etching residues by applying a residue removal composition to the etched semiconductor substrate. The order of the above steps is not interpreted to be limited and other steps may be further included between the respective steps.

Although the size of the wafer is not particularly limited, but a wafer whose diameter is 8 inches, 12 inches, or 14 inches can be preferably used (1 inch=25.4 mm).

In the specification, the meaning of "preparation" includes not only preparing a specific material by synthesizing, mixing or the like, but also supplying a predetermined substance through purchasing or the like. In addition, in the specification, the use of a composition (chemical) in the treatment for each material of the semiconductor substrate is referred to as "application" but the embodiment thereof is not particularly limited. For example, contacting the composition with the substrate is widely included and specifically, etching may be performed by immersion by a batch type device or discharge by a sheet type device.

In the specification, the meaning of a semiconductor substrate includes not only a wafer but also an entire substrate structure in which a circuit structure is provided on the wafer. A semiconductor substrate member may refer to the member constituting the semiconductor substrate defined in the above description and may be formed of a single material or a plurality of materials. The processed semiconductor substrate is sometimes referred to as a semiconductor substrate product for distinction and a chip or a processed product thereof obtained by applying processing to the processed semiconductor substrate and dicing semiconductor substrate as required refers to a semiconductor element for further distinction. That is, in a broad sense, a semiconductor element and a semiconductor product obtained by incorporating the semiconductor element belong to the semiconductor substrate product.

Examples

Hereinafter, the present invention will be specifically described with reference to examples, but the present invention is not limited to examples described below. % and part(s) for showing formulations and the formulated amounts in examples are based on mass unless otherwise specified.

(Preparation of Ruthenium Removal Composition)

Each component was mixed at a ratio shown in Table 1 below to prepare residue removal compositions to be applied to each test. The details of chemicals used are shown below. In addition, the symbol "-" in Table means that the component is not sued.

Orthoperiodic acid (manufactured by Sigma-Aldrich)
Sodium hypochlorite (manufactured by Wako Pure Chemical Industries, Ltd.)
Sodium permanganate (manufactured by Wako Pure Chemical Industries, Ltd.)
Hydroxylamine (manufactured by Wako Pure Chemical Industries, Ltd.)
Nitric acid (manufactured by Wako Pure Chemical Industries, Ltd.)
Hydrochloric acid (manufactured by Wako Pure Chemical Industries, Ltd.)
Sodium chlorate (manufactured by Wako Pure Chemical Industries, Ltd.)
Iodic acid (manufactured by Wako Pure Chemical Industries, Ltd.)
Bromic acid (manufactured by Wako Pure Chemical Industries, Ltd.)
Sodium bromate (manufactured by Wako Pure Chemical Industries, Ltd.)
Tetramethylammonium hydroxide (manufactured by SACHEM Inc.)
Tetraethylammonium hydroxide (manufactured by Wako Pure Chemical Industries, Ltd.)
Monoethanolamine (manufactured by Hayashi Pure Chemical Ind., Ltd.)
Pure water (manufactured by Fujifilm Corporation)

<Dissolution Rate (ER) Test>

For the dissolution rate (ER), substrates on which layers of Ru, CoFeB, and MgO were formed were receptively prepared a commercially available silicon wafer (manufactured by SUMCO Corporation). The layers were formed by a chemical vapor deposition (CVD) method. The thickness of each layer was 50 nm. The substrate was put into a container filled with the composition and stirred at 250 rpm for 10 minutes. The temperature of the composition during the stirring was described in Table 1 as treatment temperature. The film thicknesses of the obtained substrate before and after the etching treatment were measured using ellipsometry (Vase, spectroscopic ellipsometer, manufactured by J. A. Woollam, Japan, measurement conditions: measurement range: 1.2 to 2.5 eV, measuring angles: 70 degrees and 75 degrees), and the dissolution rate (nm/min) was calculated from the average value at five points. The results were shown in Table 1.

TABLE 1

| | | Composition | | | |
|---|---|---|---|---|---|
| | | Component A | Content (% by mass) | Component C | Content (% by mass) |
| Example | 1 | Orthoperiodic acid | 1 | Tetramethylammonium hydroxide | 0.8 |
| | 2 | Orthoperiodic acid | 1 | Tetramethylammonium hydroxide | 0.9 |

TABLE 1-continued

|  |  |  |  |  |  |
|---|---|---|---|---|---|
|  | 3 | Orthoperiodic acid | 1 | Tetramethylammonium hydroxide | 0.8 |
|  | 4 | Orthoperiodic acid | 3 | Tetramethylammonium hydroxide | 2.4 |
|  | 5 | Orthoperiodic acid | 1 | Tetraethylammonium hydroxide | 1.3 |
|  | 6 | Orthoperiodic acid | 1 | Tetramethylammonium hydroxide | 0.8 |
|  | 7 | Orthoperiodic acid | 1 | Monoethanolamine | 7.8 |
| Comparative | 8 | Orthoperiodic acid | 1 | Tetramethylammonium hydroxide | 0.4 |
| Example | 9 | Orthoperiodic acid | 1 | — | — |
|  | 10 | Hydroxylamine | 0.15 | Tetramethylammonium hydroxide | 0.015 |
|  | 11 | Nitric acid | 0.27 | Tetramethylammonium hydroxide | 0.41 |
|  | 12 | Nitric acid | 0.27 | Tetramethylammonium hydroxide | 0.41 |
|  | 13 | Hydrochloric acid | 0.16 | Tetramethylammonium hydroxide | 0.44 |
|  | 14 | Sodium chlorate | 0.46 | Tetramethylammonium hydroxide | 0.007 |
|  | 15 | Iodic acid | 0.77 | Tetramethylammonium hydroxide | 0.4 |
|  | 16 | Bromic acid | 0.35 | Tetramethylammonium hydroxide | 0.4 |
|  | 17 | Sodium bromate | 0.66 | Tetramethylammonium hydroxide | 0.01 |
|  | 18 | Sodium bromate | 0.66 | Tetramethylammonium hydroxide | 0.01 |

|  |  | Composition | | | Treatment | Dissolution rate (nm/min) | |
|---|---|---|---|---|---|---|---|
|  |  | Component B | Content (% by mass) | pH | temperature (° C.) | Ru | CoFeB |
| Example | 1 | Pure | 98.2 | 11 | 55 | 16.39 | 0 |
|  | 2 | water | 98.1 | 12 | 55 | 2.12 | 0 |
|  | 3 |  | 98.2 | 11 | 45 | 2.54 | 0 |
|  | 4 |  | 94.6 | 11 | 55 | 10.28 | 0 |
|  | 5 |  | 97.7 | 11 | 55 | 15.44 | 0 |
|  | 6 |  | 98.2 | 11 | 35 | 0.54 | 0 |
|  | 7 |  | 91.2 | 11 | 55 | 18.76 | 0 |
| Comparative | 8 | Pure | 98.6 | 3 | 25 | 1.68 | 2.0 |
| Example | 9 | water | 99 | 1.7 | 25 | 0.95 | 2.25 |
|  | 10 |  | 99.835 | 11 | 25 | 0 | 0 |
|  | 11 |  | 99.32 | 11 | 25 | 0 | 0 |
|  | 12 |  | 99.32 | 11 | 55 | 0 | 0 |
|  | 13 |  | 99.4 | 11 | 25 | 0 | 0 |
|  | 14 |  | 99.533 | 11 | 25 | 0 | 0 |
|  | 15 |  | 98.83 | 11 | 25 | 0 | 0 |
|  | 16 |  | 99.25 | 11 | 25 | 0 | 0 |
|  | 17 |  | 99.33 | 11 | 25 | 0 | 0 |
|  | 18 |  | 99.33 | 11 | 45 | 0 | 0 |

EXPLANATION OF REFERENCES

1: Hard mask
2: Free layer
3: Second ferromagnetic layer (CoFeB or CoFe)
4: Insulator layer (MgO or $Al_2O_3$)
5: First ferromagnetic layer (CoFeB or CoFe)
6a: Top electrode
6b: Base electrode
7: Residue
H: Hole
d: Damaged portion

What is claimed is:

1. A method of producing a magnetoresistive random access memory, the method comprising:
dry etching a semiconductor substrate, the semiconductor substrate including a ferromagnetic layer and a Ru-containing layer, the ferromagnetic layer including at least one of CoFeB or CoFe, and the Ru-containing layer including Ru; and
removing Ru-containing dry etching residues, using a ruthenium removal composition, without substantially dissolving the ferromagnetic layer,
wherein the ruthenium removal composition comprises orthoperiodic acid and water, a content of orthoperiodic acid in the ruthenium removal composition is from 0.1% to 3% by mass with respect to a total mass of the ruthenium removal composition, and the ruthenium removal composition has a pH of 11 or more.

2. The method according to claim 1, wherein the semiconductor substrate further includes an insulator layer that includes MgO.

3. The method according to claim 1, wherein a MgO dissolution rate of the ruthenium removal composition is 2 nm/min or less.

4. The method according to claim 1, wherein the content of orthoperiodic acid in the ruthenium removal composition is from 0.5% to 3% by mass with respect to a total mass of the ruthenium removal composition.

5. The method according to claim 1, wherein a content of water in the ruthenium removal composition is 30% by mass or more with respect to a total mass of the ruthenium removal composition.

6. The method according to claim 1, wherein the ruthenium removal composition further comprises at least one selected from the group consisting of tetramethylammonium hydroxide, tetraethylammonium hydroxide, and monoethanolamine, as a pH adjusting agent.

7. The method according to claim 6, wherein a content of the pH adjusting agent in the ruthenium removal composition is 0.01% to 5% by mass with respect to a total mass of the ruthenium removal composition.

8. The method according to claim 1, wherein the removing of the Ru-containing dry etching residues is performed at 40° C. to 55° C.

9. A method of producing a magnetoresistive random access memory, the method comprising:
dry etching a semiconductor substrate, the semiconductor substrate including a ferromagnetic layer, a Ru-containing layer and an insulator layer, the ferromagnetic layer including at least one of CoFeB or CoFe, the Ru-containing layer including Ru, and the insulator layer including MgO; and removing Ru-containing dry etching residues, using a ruthenium removal composition, without substantially dissolving the ferromagnetic layer, wherein the ruthenium removal composition comprises orthoperiodic acid and water, and the ruthenium removal composition has a pH of 11 or more.

10. The method according to claim 9, wherein a MgO dissolution rate of the ruthenium removal composition is 2 nm/min or less.

11. The method according to claim 9, wherein a content of orthoperiodic acid in the ruthenium removal composition is 0.01% to 5% by mass with respect to a total mass of the ruthenium removal composition.

12. The method according to claim 9, wherein a content of water in the ruthenium removal composition is 30% by mass or more with respect to a total mass of the ruthenium removal composition.

13. The method according to claim 9, wherein the ruthenium removal composition further comprises at least one selected from the group consisting of tetramethylammonium hydroxide, tetraethylammonium hydroxide, and monoethanolamine, as a pH adjusting agent.

14. The method according to claim 13, wherein a content of the pH adjusting agent in the ruthenium removal composition is 0.01% to 5% by mass with respect to a total mass of the ruthenium removal composition.

15. The method according to claim 9, wherein the content of orthoperiodic acid in the ruthenium removal composition is 0.01% to 3% by mass with respect to a total mass of the ruthenium removal composition.

16. The method according to claim 9, wherein a treatment temperature of the residue removal step is 40° C. to 55° C.

* * * * *